United States Patent [19]

McHugh et al.

[11] Patent Number: 5,715,143
[45] Date of Patent: Feb. 3, 1998

[54] CARRIER SYSTEM FOR INTEGRATED CIRCUIT CARRIER ASSEMBLIES

[75] Inventors: John W. McHugh, Greenwood; Patricia Louise Jones, Arcadia, both of Ind.

[73] Assignee: Delco Electronics Corporation, Kokomo, Ind.

[21] Appl. No.: 684,668

[22] Filed: Jul. 22, 1996

[51] Int. Cl.⁶ .................... B65D 73/02; H05K 1/00
[52] U.S. Cl. .................... 361/749; 361/212; 361/776; 361/807; 361/809; 174/52.4; 174/254; 257/668; 206/701; 206/713
[58] Field of Search .................... 361/750, 751, 361/789, 807, 809, 212, 749, 776; 174/52.4, 254, 268; 29/827; 257/660, 668, 688; 206/701, 713

[56] References Cited

U.S. PATENT DOCUMENTS

| | | | |
|---|---|---|---|
| 4,701,781 | 10/1987 | Sankhagowit | 361/776 |
| 5,170,328 | 12/1992 | Kruppa | 361/749 |
| 5,253,415 | 10/1993 | Dennis | 174/52.4 |
| 5,548,091 | 8/1996 | DiStefano | 174/254 |

*Primary Examiner*—Leo P. Picard
*Assistant Examiner*—John B. Vigushin
*Attorney, Agent, or Firm*—Mark A. Navarre

[57] ABSTRACT

A carrier system for an integrated circuit carrier assembly composed of a carrier member supporting an integrated circuit. The carrier system enables a number of carrier assemblies to be flexibly and sequentially interconnected, so as to form a flexible and continuous chain of carrier assemblies. The carrier system is characterized by interconnecting the carrier assemblies with a single tape that facilitates accurate alignment and placement of the carrier assemblies within the carrier system, and minimizes the risk of an adhesive buildup on the equipment used to handle the carrier system and separate the carrier assemblies from the carrier system.

20 Claims, 2 Drawing Sheets

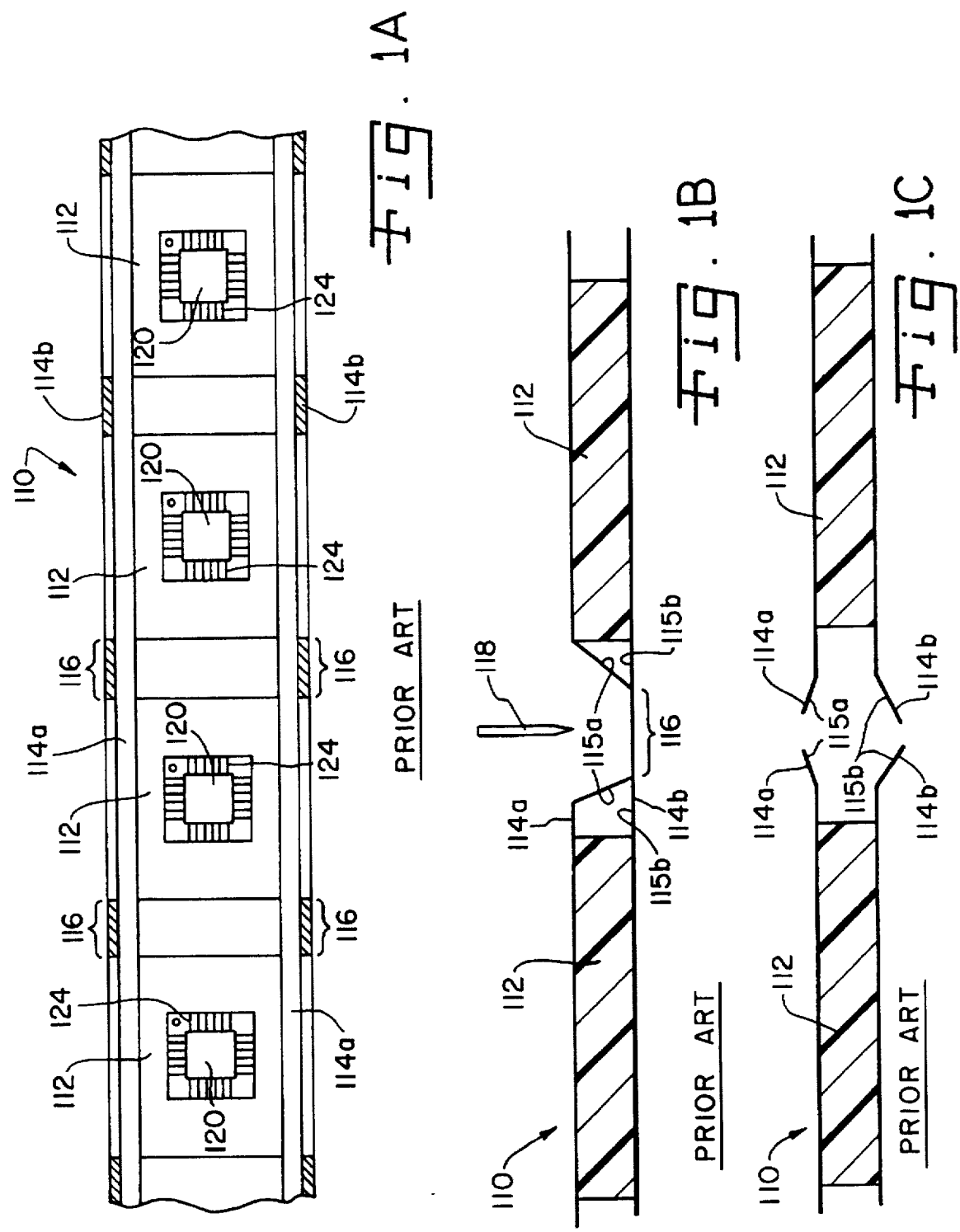

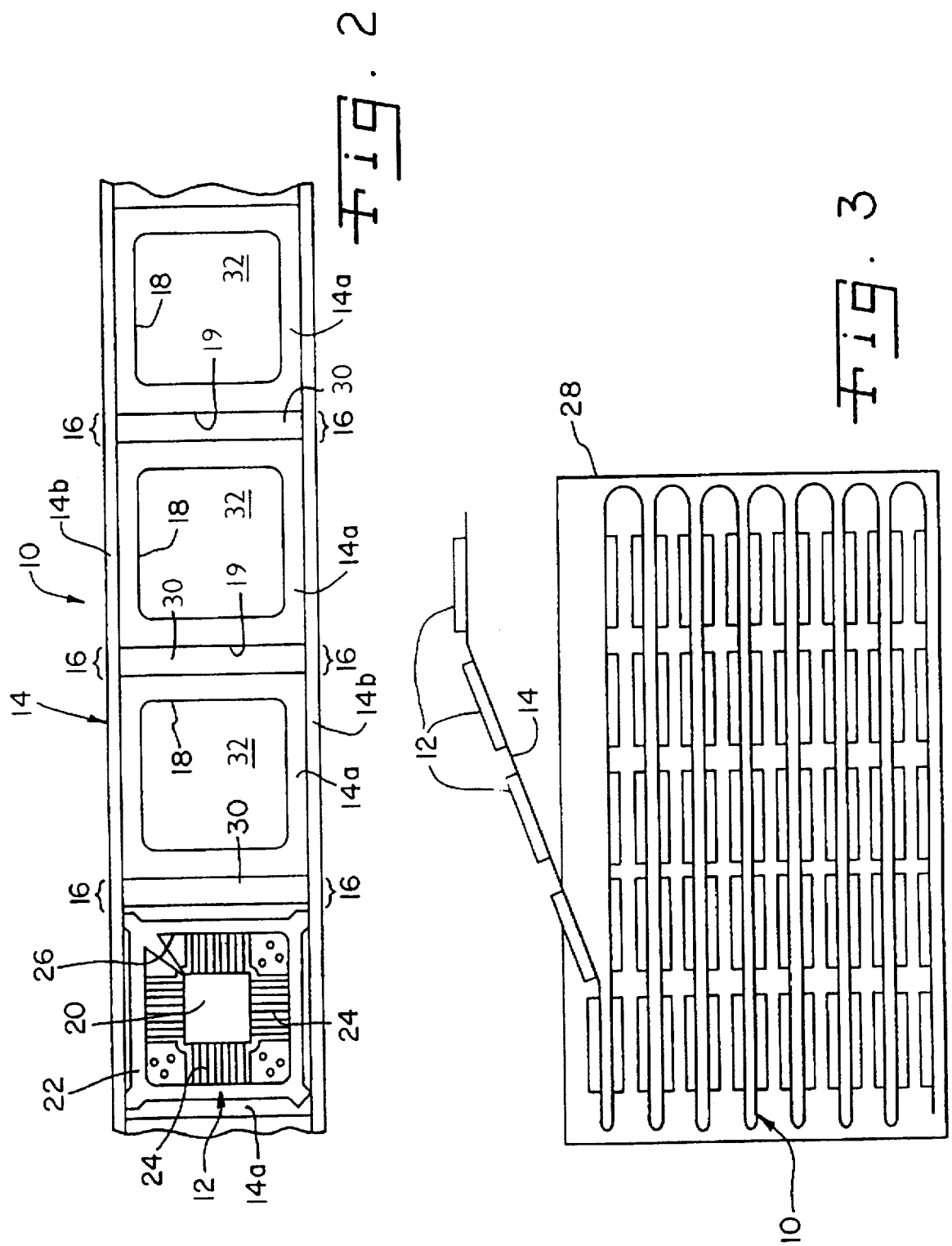

CARRIER SYSTEM FOR INTEGRATED CIRCUIT CARRIER ASSEMBLIES

FIELD OF THE INVENTION

This invention generally relates to the packaging of integrated circuits prior to mounting on a printed circuit board. More particularly, this invention relates to the packaging of molded carriers used for testing and transporting integrated circuits during assembly of a printed circuit incorporating the integrated circuit.

BACKGROUND OF THE INVENTION

Various methods are known for forming the electrical interconnections between an integrated circuit and its supporting substrate. Tape automated bonding (TAB) is one commonly known method for forming these such electrical interconnections. TAB processes employ a tape that forms any number of electrical lead patterns sequentially formed along the length of the tape. Each electrical lead pattern comprises many individual long, slender leads attached to, and extending radially inward from, the perimeter of the TAB tape. An integrated circuit is positioned on the TAB tape and gang bonded to each of the electrical leads of one of the patterns. After bonding between the integrated circuit and electrical leads is complete, the integrated circuit is excised from the TAB tape, and then mounted on and bonded to an appropriate printed substrate.

The integrity of the individual integrated circuit assemblies must be maintained throughout processing, but particularly during the period after the integrated circuit has been bonded to the electrical leads but not yet excised from the TAB tape. During this period, the TAB tape, integrated circuit and patterned slender electrical leads must be maintained in a substantially planar manner to ensure the integrity of the assembly for subsequent attachment of the integrated circuit to its substrate. Therefore, a carrier member is often used to support the integrated circuit and its electrical leads. The carrier member is typically formed from a molded plastic or other relatively inexpensive yet durable material, with the shape of the carrier member being such that it circumscribes and secures the perimeter of the TAB tape. After molding, the carrier assembly, which includes the carrier member, integrated circuit and leads, is fed into an assembly machine which then excises the integrated circuit and leads from the carrier member and mounts the integrated circuit onto an appropriate printed circuit.

During assembly and transport, these carrier assemblies were traditionally stacked vertically or horizontally and individually fed into the assembly machine. Disadvantages are inherent with this method, such as the complex packaging and feed systems required to handle the individual carrier assemblies, the expense of packaging each assembly individually, and the added waste and bulk as a result of the individual packaging for each assembly. As a solution, U.S. Pat. No. 5,170,328 to Kruppa, assigned to the assignee of the present invention, discloses a packaging system for carrier assemblies that enables the assemblies to be provided in a continuous manner, such that the packaging system is amenable to the automatic feed handling systems used to attach the integrated circuit within a carrier member to a printed circuit board.

The packaging system disclosed by Kruppa is illustrated in FIGS. 1A through 1C. As shown, the packaging system 110 is composed of molded carrier members 112, each of which having an integrated circuit 120 that has been previously bonded to the electrical leads 124 of a TAB tape. The carrier members 112 are interconnected by two pairs of adhesive tape 114a and 114b attached to opposing edges of each carrier member 112. Each tape pair 114a and 114b is adhered to the top and bottom surfaces of each carrier member 112, sandwiching the carrier member 112 therebetween. The carrier members 112 are spaced a distance apart form each other, so that a gap exists between each adjacent pair of carrier members 112. The size of the gap is determined to impart flexibility to the chain of carrier members 112.

As more readily seen in FIG. 1B, each of the tape pairs 114a and 114b form a flexible link 116 between adjacent carrier members 112. The links 116 are formed as a result of the facing surfaces 115a and 115b of each tape pair 114a and 114b having an adhesive that enables the tapes 114a and 114b to adhere to the carrier members 112. While the links 116 provide flexibility to the packaging system 110 that enables the carrier members 112 and their integrated circuits 120 to fold over one another or be hinged similar to a chain, problems can arise with the tapes 114a and 114b during handling. As is evident from FIG. 1A, there is the likelihood that the tape pairs 114a and 114b will not be accurately aligned when applied to the carrier members 112, resulting in exposed adhesive on both surfaces 115a and 115b that can interfere with the flow of the packaging system 110 through the handling equipment. In addition, and as illustrated in FIG. 1C, after severing the links 116 with a knife 118 or other suitable cutting tool, the free ends of the tapes 114a and 114b may separate, exposing the adhesive on the facing surfaces 115a and 115b in a manner that can interfere with the placement of the integrated circuit 120 on its substrate. The requirement to cut through the links 116 to separate the carrier members 112 also leads to an adhesive buildup on the knife 118, necessitating periodic cleaning. Finally, some difficulty can arise with maintaining a desired part-to-part pitch between adjacent carriers 112, since the tapes 114a and 114b cannot assist in regulating the gap between carrier members 112.

Accordingly, though Kruppa advantageously provides a packaging system that enables carrier assemblies to be fed continuously into subsequent test equipment and assembly machines for attaching the integrated circuit to a printed circuit board, it would be desirable if packaging system of Kruppa could be improved to further promote its unique and advantageous aspects.

SUMMARY OF THE INVENTION

It is an object of this invention to provide a flexible carrier system for carrier assemblies composed of integrated circuits individually supported by carrier members.

It is a further object of this invention that such a carrier system provides a flexible and continuous chain of these carrier assemblies.

It is another object of this invention that such a carrier system is configured to promote the ease with which the carrier assemblies are placed and secured within the carrier system, and to minimize maintenance and complications associated with its implementation within high volume testing and assembly processes.

In accordance with a preferred embodiment of this invention, these and other objects and advantages are accomplished as follows.

According to the present invention, there is provided a carrier system for integrated circuit carrier assemblies, each of which is composed of a carrier member supporting an integrated circuit bonded to the electrical leads of a TAB tape. The carrier system enables a number of carrier assemblies to be flexibly and sequentially interconnected, so as to form a flexible and continuous chain of carrier assemblies. The carrier system is further characterized by interconnecting the carrier assemblies in a manner that facilitates accurate alignment and placement of the carrier assemblies within the carrier system, and minimizes the risk of an adhesive buildup on the equipment used to handle the carrier system and separate the carrier assemblies from the carrier system for testing and assembly to a circuit board.

More particularly, the invention entails an integrated circuit carrier system providing a plurality of support surface regions and connecting regions that interconnect each adjacent pair of support surface regions. These regions are preferably defined on one surface of a single flexible strip or tape member. Each of the support surface regions is preferably defined by an outer peripheral edge and an inner peripheral edge, with at least a portion of each support surface region being adhesive for securing one of the carrier assemblies thereto. In contrast, the connecting regions interconnecting the support surface regions are free of any adhesive, and therefore provide regions on the carrier system at which the carrier assemblies can be singulated without causing an adhesive buildup on a cutting tool.

In combination with the carrier assemblies, the integrated circuit carrier system forms a flexible and continuous chain of carrier assemblies, which enables the carrier assemblies to be fed continuously into subsequent test and assembly machines utilized to attach the integrated circuits to a printed circuit board. In addition, the peripheral edges of the support surface regions also provide a feature by which the carrier assemblies can be accurately positioned and aligned to achieve a repeatable part-to-part pitch, which facilitates automated handling of the carrier system and its carrier assemblies.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which:

FIGS. 1A through 1C illustrate a carrier system for integrated circuit carrier assemblies as disclosed in U.S. Pat. No. 5,170,328;

FIG. 2 is a plan view of a carrier system for integrated circuit carrier assemblies in accordance with this invention; and FIG. 3 is a cross-sectional view of the carrier system of FIG. 2 in the process of being dispensed from a protective container.

DETAILED DESCRIPTION OF THE INVENTION

As shown in FIGS. 1 and 2, the present invention provides a carrier system 10 for testing and transporting carrier assemblies 12 (only one of which is illustrated) composed of a number of carrier members 22, each of which supports an integrated circuit 20 bonded to the electrical leads 24 of a TAB tape. The carrier system 10 provides a flexible and continuous chain of carrier assemblies 12, which permits the carrier assemblies 12 to be fed continuously into subsequent test and assembly machines utilized to attach each integrated circuit 20 to a printed circuit board.

FIG. 2 illustrates a preferred embodiment of this invention, in which the carrier system 10 is composed of carrier assemblies 12 supported on a single flexible tape 14. As is generally conventional, the carrier member 22 is shown as having a central opening 26 in which the integrated circuit 20 is supported by its electrical leads 24. The electrical leads 24 are preferably formed and bonded to the integrated circuit 20 using TAB technology. The integrated circuit 20 and its electrical leads 24 are maintained in a substantially planar manner by the carrier member 22, which is preferably formed around the electrical leads 24 after they have been bonded to the integrated circuit 20. The carrier member 22 may be formed from any material which is durable, electrically dielectric and relatively inexpensive, such as a plastic.

In practice, any number of carrier assemblies 12 can be interconnected by means of the tape 14, which may by of any suitably strong and flexible material, such as polyester. While a particular configuration is depicted for the tape 14, it is foreseeable that various other shapes and configurations could be employed. As shown, the tape 14 is delineated to form square-shaped support regions 14a and lateral edge regions 14b. The lateral edge regions 14b form flexible links 16 that interconnect each adjacent pair of support regions 14a. Each of the support regions 14a is preferably defined by inner and outer peripheral edges 18 and 19, the former of which defines an aperture 32 within each support region 14a. As is apparent from FIG. 2, the aperture 32 formed by the inner peripheral edges 18 is approximately aligned with the opening 26 in the carrier member 22, such that the integrated circuit 20 and its leads 24 are suspended over the aperture 32 by the carrier member 22. The laterally-disposed outer peripheral edges 19 and the links 16 also define apertures 30 in the tape 14. Together, the laterally-disposed portions of the inner and outer peripheral edges 18 and 19 form opposing edges of a cross-member that extends between the lateral edge regions 14b of the tape 14.

The apertures 30 and 32 in the tape 14 can be precisely located and sized using die cutting techniques, and therefore provide reference features that assist in the placement of the carrier assemblies 12 on the tape 14, such as through the use of a closed loop optical system known in the art. By example, an edge of the carrier member 22 can be precisely aligned with one of the lateral outer peripheral edges 19 of the support region 14a using an optical system, such that accurate positional control is achieved by the accuracy of the optical equipment used and the process by which the apertures 30 and 32 are formed.

An adhesive material, such as an acrylic, covers at least a portion of, and preferably the entire support region 14a for the purpose of adhering a carrier assembly 12 to the tape 14. A preferred adhesive is pressure sensitive for ease in applying the tape 14 to the carrier assemblies 12, though it is foreseeable that a heat sensitive adhesive could be applied by exposing the tape 14 to an appropriate temperature. In contrast, at least the links 16, and preferably the entire lateral edge regions 14b that include the links 16, are free of any adhesive. As such, a cutting tool is able to separate the carrier assemblies 12 of the carrier system 10 at the links 16 without causing an adhesive buildup on the tool. Furthermore, because adhesive is not present at the lateral edge regions 14b of the tape 14, there is a reduced tendency for adhesive to be unintentionally transferred to the handling equipment.

At least a portion of the tape 14 includes an electrically conductive layer, which enables the tape 14 to be electrically conductive along its entire length. As such, the conductive layer serves to protect the integrated circuits 20 from electrostatic discharges in the vicinity of the carrier system 10.

More preferably, all surfaces of the tape 14 are metallized, with preferred metals for the metallization being aluminum and nickel, though a conductive PVC or polystyrene could also be used.

To impart flexibility to the carrier system 10, the carrier assemblies 12 are spaced apart along the length of the tape 14, as dictated by length of the links 16 and the distance between the outer peripheral edges 19 of the support regions 14a. The required spacing between carrier assemblies 12 is determined by the requirements of the subsequent processing machines and tolerances. Theoretically, the spacing could be quite large, though for practical purposes it is desirable that spacing between carrier assemblies 12 be limited to one to two times the thickness of the carrier member 22. With the preferred spacing dimension, the flexible links 16 are sufficiently long to permit the carrier assemblies 12 to fold over one another or be hinged similar to a chain. This allows the carrier assemblies 12 to be transported, stored and dispensed from a protective container 28, as depicted in FIG. 3. As shown, the carrier assemblies 12 are layered within the container 28. In this manner, the carrier assemblies 12 can be continuously fed, instead of individually fed, into an assembly machine such as a trim and form machine. Advantageously, tapes 14 configured in accordance with this invention can be readily spliced together, such that carrier systems 10 within different containers 28 can be spliced together at the assembly station without interrupting the operation of the assembly machine.

In practice, after the tape 14 has been appropriately die cut and the adhesive has been applied to the support regions 14a, a backing tape is preferably applied to the adhesive to facilitate handling of the tape 14 and to allow the tape 14 to be collected on a spool for use during the packaging process. The tape 14 can then be dispensed from the spool and the carrier assemblies 12 precisely located and adhered to the support regions 14a with the adhesive. Afterwards, a cutting tool serves to sever the links 16 between each adjacent pair of carrier assemblies 12 just prior to their being tested or placed on a circuit board. The integrated circuits 20 may then be excised from their carrier members 22. The carrier members 22, with the tape 14 still adhered thereto, may then be discarded.

From the above, it can be appreciated that the carrier system 10 of this invention offers significant advantages over the prior art. Because only the support regions 14a are provided with an adhesive for securing the carrier assemblies 12, the remaining regions of the tape 14, and particularly the links 16, can be cut without causing a buildup of adhesive on the cutting tool. As such, downtime for cleaning adhesive from the cutting tool during the carrier singulation process can be completely eliminated. Absence of an adhesive on the links 16 further minimizes downtime because the free ends of the links 16 formed during singulation are less likely to interfere with equipment used to transport and place the integrated circuit 20. Finally, the cross-members formed by the support regions 14a between the inner and outer peripheral edges 18 and 19 serve to anchor the links 16, and therefore prevent the links 16 from forming "stringers" that might become entangled in the assembly equipment.

In addition, the relatively large adhesive surfaces provided by the support regions 14a reduce the likelihood of a carrier assembly 12 being dislodged from the tape 14 during handling. Finally, the peripheral edges 18 and 19 of the support regions 14a can be precisely formed using conventional techniques to provide features that can be readily used to detect the position of the tape 14 relative to the carrier assemblies 12 as they are placed on the support regions 14a.

As such, the carrier assemblies 12 can be accurately positioned and aligned on the tape 14 to achieve a precise and repeatable part-to-part pitch, which facilitates automated handling of the carrier system 10 and its carrier assemblies 12.

While the invention has been described in terms of a preferred embodiment, it is apparent that other forms could be adopted by one skilled in the art, including the use of a different tape material or configuration, the use of carrier members and assemblies that differ from that illustrated, and the use of integrated circuits that have been previously wire bonded to an electrical lead frame. Accordingly, the scope of the invention is to be limited only by the following claims.

The embodiments of the invention in which an exclusive property or privilege is claimed are defined as follows:

1. An integrated circuit carrier for flexibly and sequentially interconnecting carrier members so as to form a flexible chain of the carrier members and enable the carrier members to be folded over one another, the integrated circuit carrier comprising:

a plurality of support surface regions, each of the support surface regions being defined by an outer peripheral edge and an inner peripheral edge, at least a portion of each of the support surface regions being adhesive for securing one of the carrier members thereto; and connecting regions interconnecting each adjacent pair of the support surface regions, each of the connecting regions comprising flexible regions spaced apart so as to define an aperture therebetween and between adjacent pairs of the support surface regions, the connecting regions being free of adhesive.

2. An integrated circuit carrier as recited in claim 1 wherein the support surface regions and connecting regions are defined on a flexible strip comprising an electrically conductive layer.

3. An integrated circuit carrier as recited in claim 1 wherein the support surface regions circumscribe apertures disposed in the integrated circuit carrier.

4. An integrated circuit carrier as recited in claim 3 further comprising a plurality of carrier members, each of the carrier members having an aperture aligned with the aperture of a corresponding one of the support surface regions.

5. An integrated circuit carrier as recited in claim 4 further comprising an integrated circuit supported within the aperture of each of the carrier members.

6. An integrated circuit carrier as recited in claim 5 wherein each of the integrated circuits has a plurality of electrical leads attached thereto and extending outwardly therefrom, each of the carrier members retaining one of the integrated circuits by rigidly retaining the electrical leads thereof.

7. An integrated circuit carrier comprising:

a plurality of integrated circuits, each of the integrated circuits having a plurality of electrical leads attached thereto and extending outwardly therefrom;

a plurality of carrier members, each of the carrier members retaining one of the integrated circuits by rigidly retaining the electrical leads of the integrated circuits; and means for flexibly and sequentially interconnecting the carrier members so as to form a flexible chain of the carrier members that enables the carrier members to be folded over one another, the interconnecting means comprising a plurality of support surface regions interconnected with connecting regions, at least a portion of each of the support surface regions adhesively securing one of the carrier members thereto, the connecting regions being free of adhesive.

8. An integrated circuit carrier as recited in claim 7 wherein the interconnecting means comprises a flexible strip having an electrically conductive layer.

9. An integrated circuit carrier as recited in claim 7 wherein each of the support surface regions is defined by an outer peripheral edge and an inner peripheral edge.

10. An integrated circuit carrier as recited in claim 9 wherein a peripheral edge of each carrier member is aligned with the outer peripheral edge of a corresponding one of the support surface regions.

11. An integrated circuit carrier as recited in claim 7 wherein each of the connecting regions comprises a pair of flexible regions spaced apart so as to define an aperture therebetween and between adjacent pairs of the support surface regions.

12. An integrated circuit carrier as recited in claim 11 wherein the pair of flexible regions forms oppositely-disposed lateral edge portions of the interconnecting means.

13. An integrated circuit carrier as recited in claim 7 wherein each of the support surface regions circumscribes an aperture disposed in the interconnecting means, each of the carrier members having an aperture aligned with the aperture in a corresponding one of the support surface regions.

14. An integrated circuit carrier as recited in claim 13 wherein one of the integrated circuits is disposed within the aperture of a corresponding one of the carrier members.

15. An integrated circuit carrier comprising:
a plurality of integrated circuits, each of the integrated circuits having a plurality of electrical leads attached thereto and extending outwardly therefrom;
a plurality of carrier members, each of the carrier members retaining one of the integrated circuits by rigidly retaining the electrical leads of the integrated circuits in a substantially planar direction; and
a single tape member sequentially interconnecting the carrier members so as to form a flexible chain of the carrier members and enable the carrier members to be folded over one another, the tape member comprising a plurality of support surface regions interconnected with connecting regions, each of the support surface regions being defined by an outer peripheral edge and an inner peripheral edge, at least a portion of each of the support surface regions adhesively securing one of the carrier members thereto, the connecting regions comprising oppositely-disposed lateral edges of the tape member that define an aperture therebetween and between adjacent pairs of the support surface regions, the connecting regions being free of adhesive.

16. An integrated circuit carrier as recited in claim 15 wherein the tape member comprises an electrically conductive layer.

17. An integrated circuit carrier as recited in claim 15 wherein each of the carrier members is aligned with the outer peripheral edge of a corresponding one of the support surface regions.

18. An integrated circuit carrier as recited in claim 15 wherein each of the support surface regions circumscribes an aperture disposed in the tape member.

19. An integrated circuit carrier as recited in claim 18 wherein each of the carrier members has an aperture aligned with the aperture in a corresponding one of the support surface regions.

20. An integrated circuit carrier as recited in claim 19 wherein one of the integrated circuits is disposed within the aperture of a corresponding one of the carrier members.

* * * * *